United States Patent [19]
Gundry

[11] Patent Number: 4,493,091
[45] Date of Patent: Jan. 8, 1985

[54] ANALOG AND DIGITAL SIGNAL APPARATUS

[75] Inventor: Kenneth J. Gundry, San Francisco, Calif.

[73] Assignee: Dolby Laboratories Licensing Corporation, San Francisco, Calif.

[21] Appl. No.: 375,037

[22] Filed: May 5, 1982

[51] Int. Cl.³ .................. H04B 12/02; H03G 7/00
[52] U.S. Cl. ......................... 375/30; 333/14; 340/347 AD; 381/31; 381/106
[58] Field of Search ............... 375/25, 26, 30, 31, 375/32, 34, 122; 455/63, 72, 266; 333/14; 360/25, 32; 340/347 CC, 347 AD, 347 M, 347 DA; 370/109, 118; 332/11 R, 11 D; 381/29, 31, 32, 101, 106

[56] References Cited

U.S. PATENT DOCUMENTS

| | | | |
|---|---|---|---|
| 3,026,375 | 3/1962 | Graham | 375/32 |
| 3,729,678 | 4/1973 | Glasberger et al. | 375/28 |
| 3,795,876 | 3/1974 | Takahashi et al. | 381/29 |
| 4,008,435 | 2/1977 | Oshima et al. | 375/28 |
| 4,271,332 | 6/1981 | Anderson | 333/14 |

*Primary Examiner*—Benedict V. Safourek
*Attorney, Agent, or Firm*—Majestic, Gallagher, Parsons & Siebert

[57] ABSTRACT

In order to reduce the effect of modulation of the quantizing error (noise) by the signal in an adaptive digital audio system and to increase the dynamic range of the system, the adaptive analog to digital converter is preceded by a frequency dependent network that changes the shape of its characteristic in response to a control signal. The control signal is derived from the variable scaling factor in the adaptive converter. After transmission via a transmission channel or record/playback process, complementary operations are performed by a digital to analog converter followed by a further frequency dependent variable response network.

26 Claims, 8 Drawing Figures

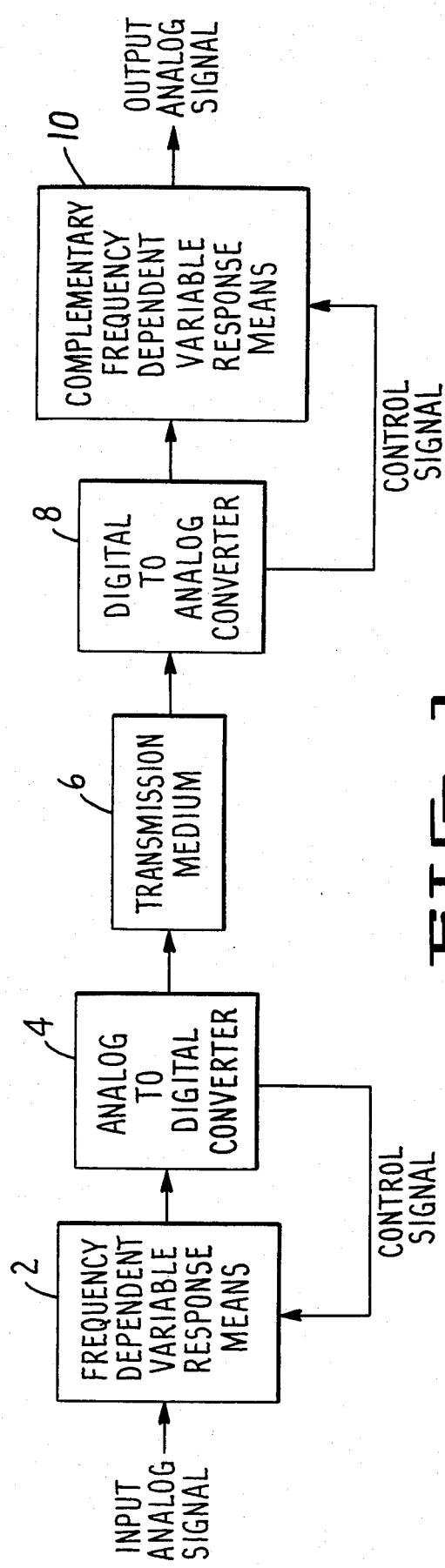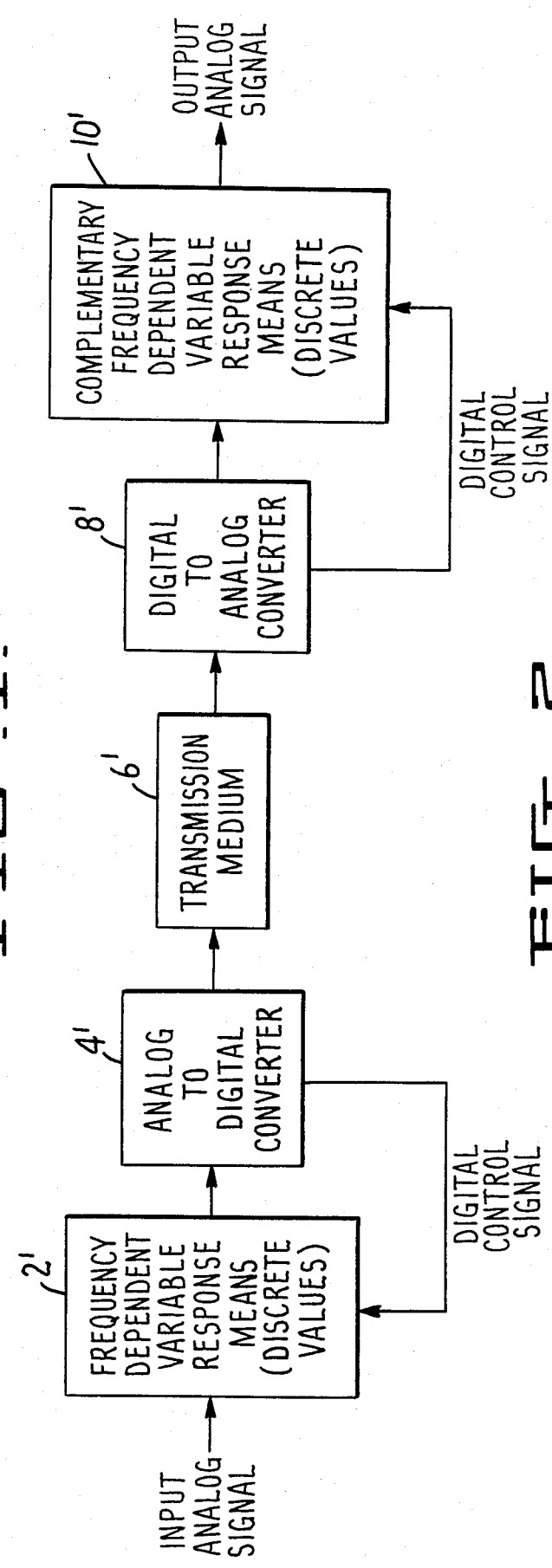

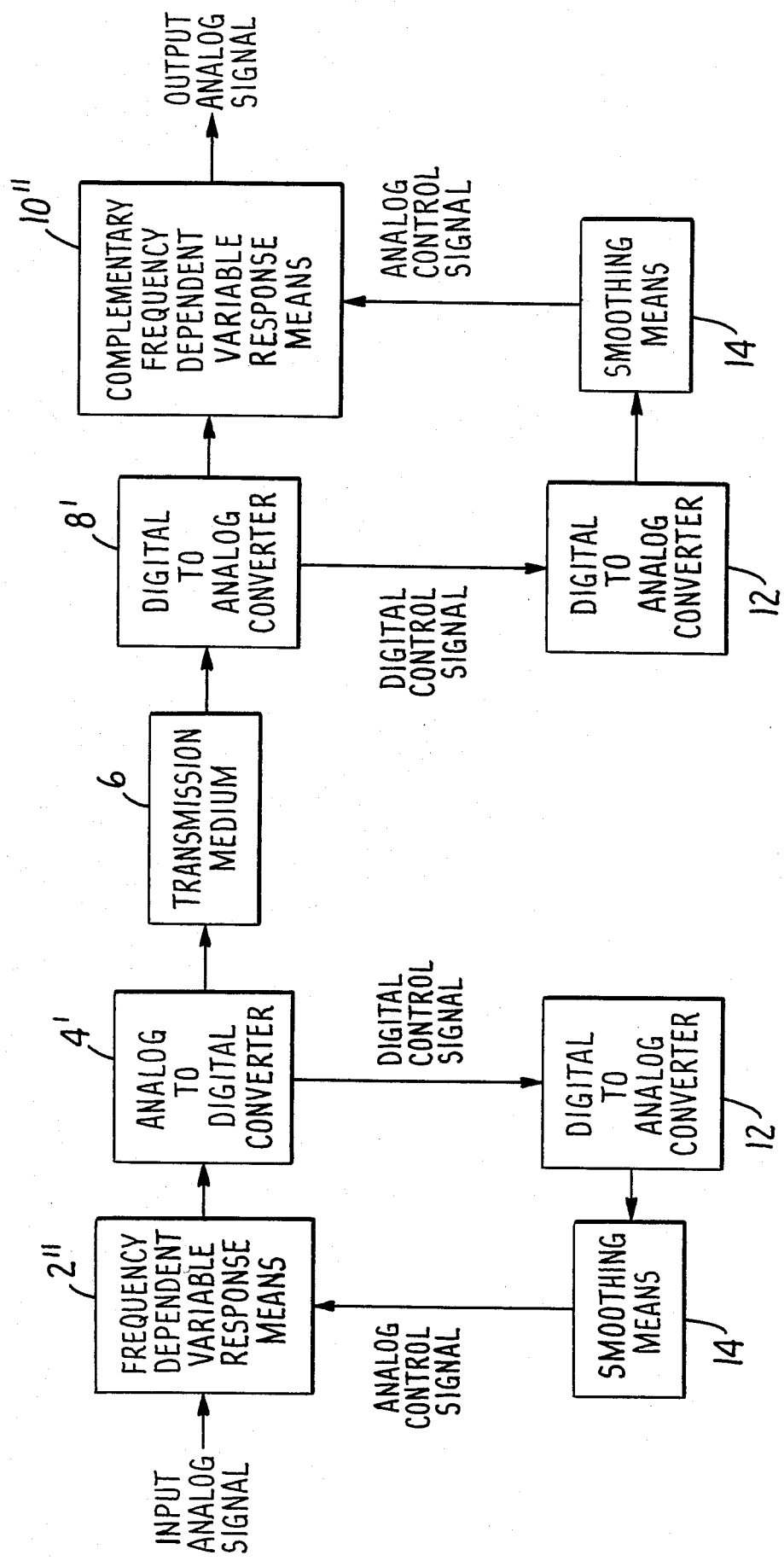

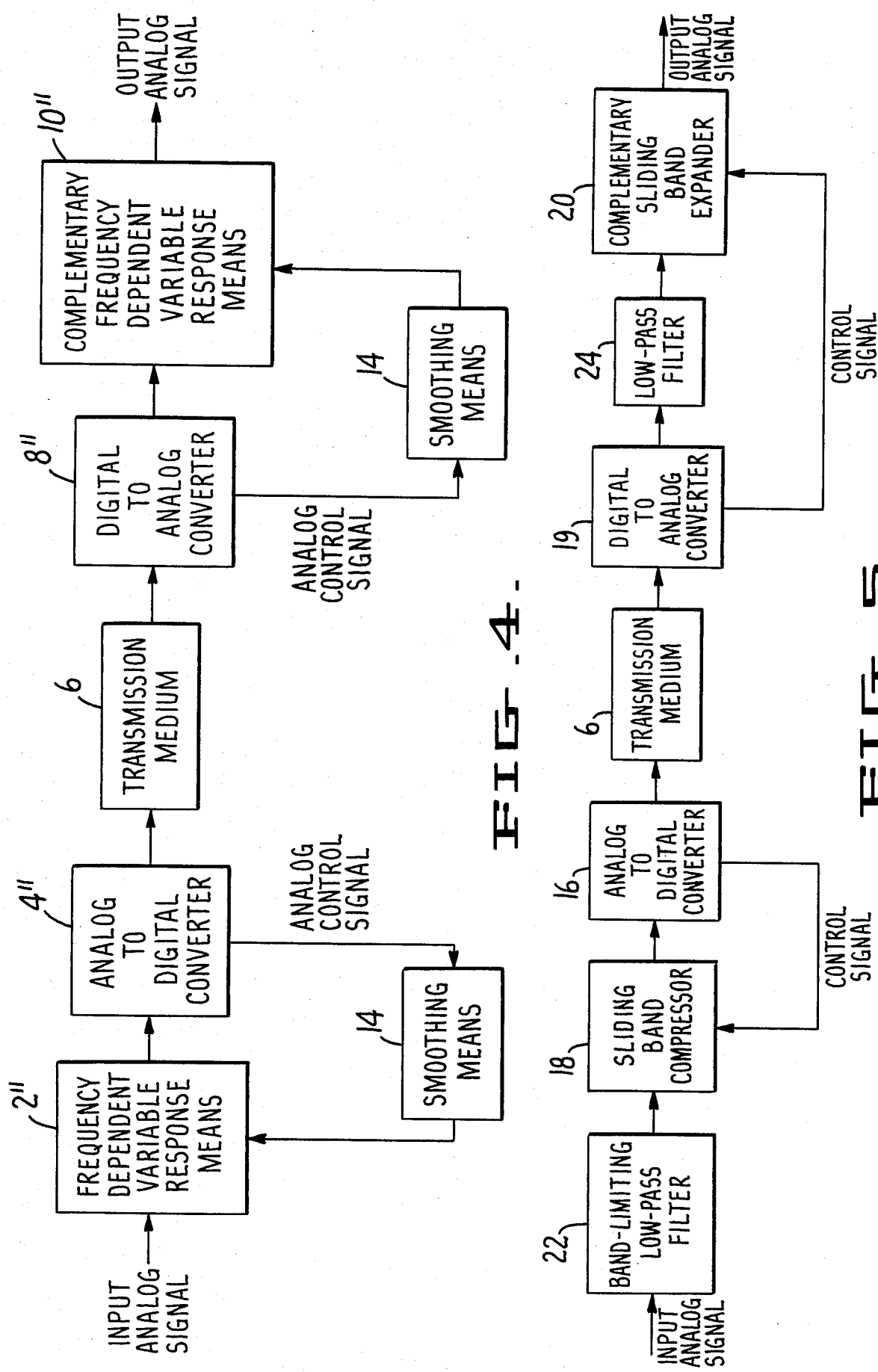

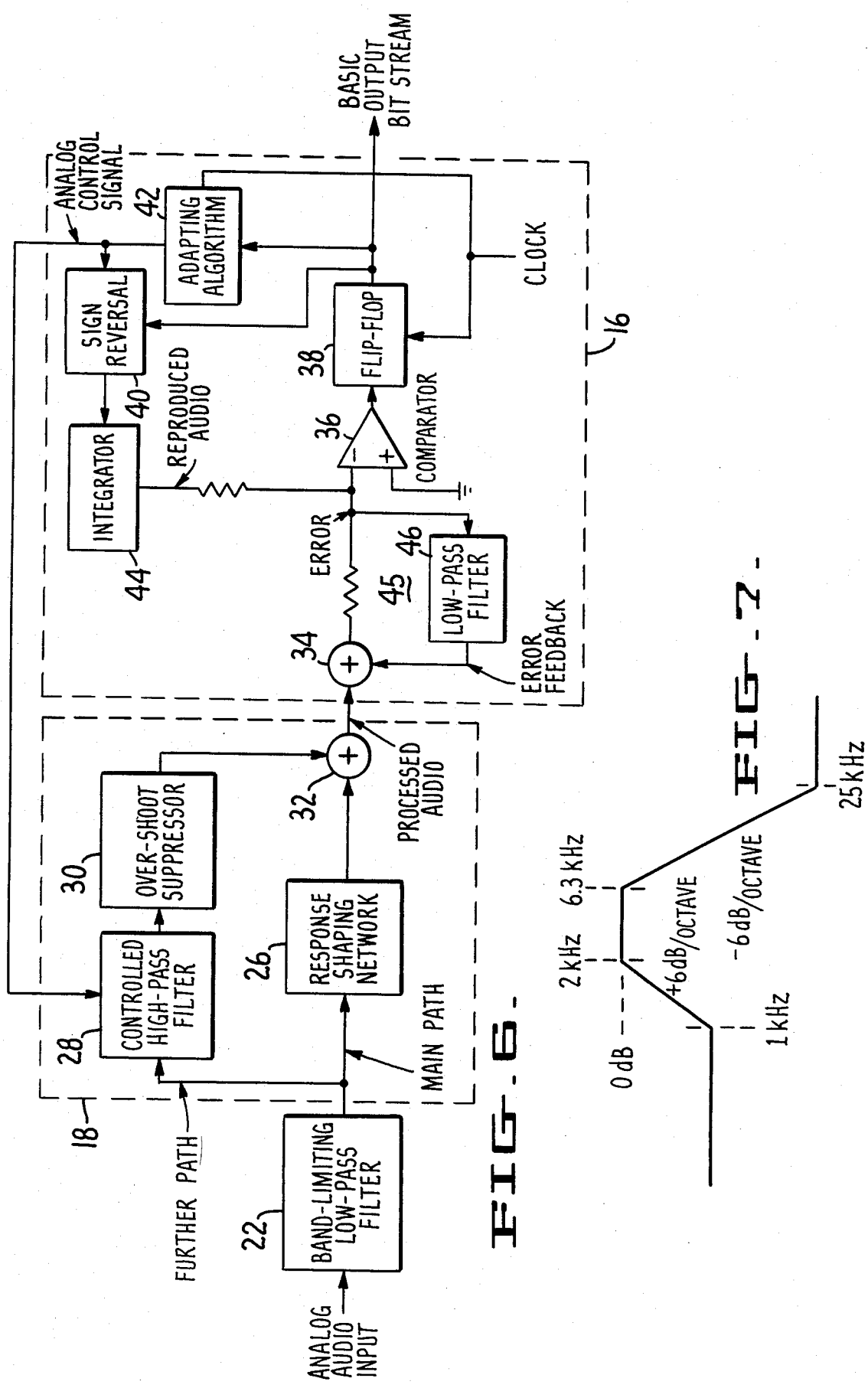

ANALOG AND DIGITAL SIGNAL APPARATUS

BACKGROUND OF THE INVENTION

In digital audio systems there is frequently a need to provide a wider dynamic range than can be achieved using the available transmission and/or recording data and error rates. Such increased dynamic range can be provided by the use of techniques whereby the characteristics of the analog to digital converters (ADC's) and digital to analog converters (DAC's) are not fixed but adapt to the program. In one type of adaptive digital audio system, companders of the logarithmic type (often referred to as wide-band companders) have been used to increase dynamic range. Alternatively, digital techniques have also been employed to provide the adapting function, for example by non-linear quantizing or variable scaling systems.

Both analog and digital companding schemes as applied to digital systems potentially suffer from the defect that while dynamic range (the ratio of the maximum to minimum signals which can be accommodated) is increased, the level of quantizing error becomes variable, leading to perceptible modulation of this error (usually considered as noise) by the signal. In analog companders the audible effects of this modulation can be reduced by band-splitting or sliding band techniques whereby the degradation of signal to noise ratio accompanying a particular signal is confined to the same area of the spectrum as the signal, leaving the noise levels in other parts of the spectrum unaffected. By this means the increase in noise is masked. Examples of band-splitting analog companders are given in U.S. Pat. No. 3,846,719, U.S. Pat. No. 3,903,485 and *Journal of the Audio Engineering Society*, Vol. 15, No. 4, Oct., 1967, pp. 383-388. Analog companders employing sliding band techniques are described in U.S. Pat. No. Re. 28,426, U.S. Pat. No. 3,757,254, U.S. Pat. No. 4,072,914, U.S. Pat. No. 3,934,190 and Japanese patent application No. 55529/71.

In digital companders involving non-linear quantizing or variable scaling, where the program-adaptation takes place in the digital realm, it is usually impractical to eliminate noise modulation by band-splitting or sliding, and designers have been forced to use fixed response shaping networks (pre- and de-emphasis) to reduce the audibility of the noise variation. Such methods operate not by preventing the modulation of noise in one area of the spectrum by signal in another but by altering the spectrum of the noise in the hope that noise in the most audible range of the spectrum (usually high frequencies) will remain inaudible even when it has risen to its highest level as a result of adaptation in response to a signal at a frequency which will not mask this most audible noise. Unfortunately, this is often a vain hope, and pre-emphasized digital companders usually give audible noise modulation on critical musical material.

The permissible response of a shaping network is a compromise between two incompatible requirements. At the output of the DAC, it is desirable to introduce a large loss at the frequencies at which noise or error is most audible; the input of the ADC will then require the inverse network, giving a large gain at these frequencies. However this gain increases the probability of system overload, and hence reduces the effective dynamic range of the system to wide-band signals. In other words, pre- and de-emphasis do not necessarily increase the dynamic range.

SUMMARY OF THE INVENTION

In accordance with the teachings of the present invention, the need for such a compromise is reduced or eliminated while at the same time providing a digital encoding/decoding system with an increased dynamic range that can be implemented with simple and low cost hardware.

According to the present invention a frequency dependent variable response network, with or without associated gain is provided in combination with an ADC and a DAC. The frequency dependent variable response network changes the shape of its response characteristic in response to a control signal. The invention may be viewed as an adaptive pre- and de-emphasis in combination with the ADC and DAC, whereby the most audible noise is reduced by the response shaping network whenever input signal amplitudes do not lead to system overload, but when overload would occur, the networks adapt to avoid boosting predominant spectral components while retaining noise reduction where noise might be audible in the presence of those spectral components. Such a system permits much more boost and cut in the presence of predominant signals at frequencies where noise is not a problem, and can therefore render noise modulation inaudible.

Band-splitting and sliding band analog companders such as cited above, are of course examples of adaptive pre- and de-emphasis; in addition to frequency dependent variable response (i.e. adaptive response) networks they normally include their own circuits to measure the amplitude and spectrum of the audio signals to operate the variable response or adaption.

In adaptive digital systems using variable scaling, the ADC contains a control signal or scaling factor, usually digitally derived, which must be reconstructed in the DAC. It is known to use such a digitally derived control signal to operate on frequency independent variable gain elements before the ADC and after the DAC, but the discussion above will show that such a technique will lead to still more noise modulation. However the control signal may be employed to operate on adaptive response networks; the control signal can be regarded as a digitally derived measurement of the audio signal which is originally generated in the ADC and which can be reconstructed to any desired degree of accuracy at the DAC. Hence one of the major problems in an analog compander, that of making the identical measurement of the signal at the sending and receiving ends, is eliminated, and accurate "tracking" between the variable pre- and de-emphasis is easier to achieve.

BRIEF DESCRIPTION OF THE DRAWINGS

FIG. 1 is a generalized block diagram showing a system embodying the present invention.

FIGS. 2-4 are generalized block diagrams showing alternative variable response networks and forms of control signals therefor.

FIG. 5 is a block diagram showing a more specific system embodying the invention.

FIG. 6 is a block diagram showing an encoder embodying the invention.

FIG. 7 is an exemplary frequency response curve of a network employed in the encoder of FIG. 6.

DETAILED DESCRIPTION OF THE INVENTION

Figure 8:
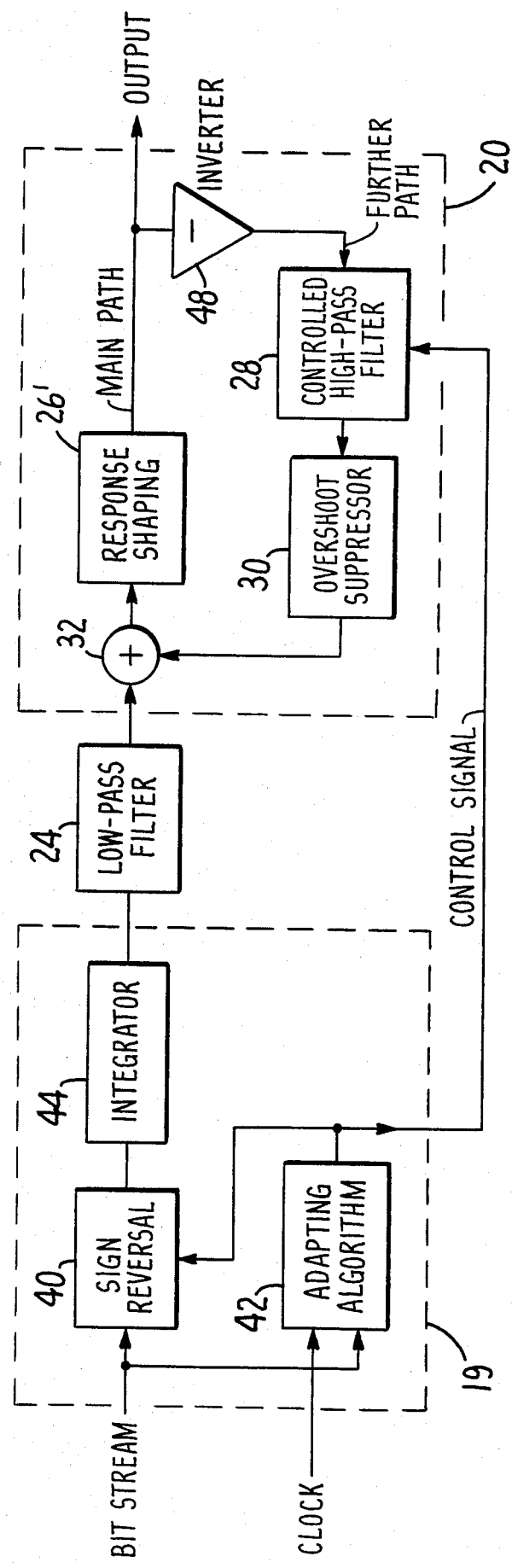
FIG. 8 is a block diagram showing a decoder embodying the invention.

Referring now to FIG. 1, a generalized block diagram of a digital encoder/decoder system embodying the invention is shown in which an analog input signal is applied to a frequency dependent variable response network 2 which processes the analog input signal prior to its application to an analog to digital converter (ADC) 4. The ADC 4 has characteristics that adapt to an applied signal and includes means for generating a control signal derived from the applied signal for controlling the characteristics. Various types of adaptive ADC's and digital to analog converters (DAC's) are well known in the prior art. Examples include adaptive pulse code modulation (PCM) and adaptive delta modulation devices. One common form of adaptation is to vary quantization step sizes as a function of the input signal parameters. The ADC 4 output is applied to a transmission medium 6 and then to an adaptive DAC 8, the output of which is applied to a frequency dependent variable response network 10 that has characteristics complementary to network 2. The transmission medium 6 can take many forms; for example, direct recording or transmission by wire or through space or by further modulation or encoding prior to recording or transmission. DAC 8 develops a control signal that can be substantially identical to the ADC 4 control signal. Network 10 is controlled by the DAC 8 control signal to restore the analog signal to substantially its original form.

In practice, the frequency dependent variable response networks will take the form of frequency dependent variable gain devices such as fixed band or sliding band compressors and expanders (compander systems) in which the frequency dependent characteristics respond to the control signal derived from the signal applied to the ADC.

The digitally derived control or scaling factor in the adaptive ADC and DAC may take a number of different forms depending on the nature of the digital coding scheme. Referring to FIG. 2, in a PCM system employing automatic ranging (e.g., "floating point"), either instantaneous or near-instantaneous, it will consist of a digital word of a few bits (typically 2 or 3) representing the sample magnitudes quantized rather coarsely. Each magnitude may be employed to switch in appropriate discrete pre- and de-emphasis network characteristics, increasing magnitudes corresponding to diminishing amounts of boost and cut in the discrete networks 2' and 10', respectively. The ADC and DAC are shown as blocks 4' and 8', respectively. Alternatively, as shown in FIG. 3, in such a PCM system the magnitude may be decoded and smoothed into an analog control voltage or current to control continuously variable networks 2" and 10" by means of separate DAC's 12 and smoothing means 14 in the encoder and decoder portion of the system.

As shown in FIG. 4, in some systems, including continuously variable slope adaptive delta-modulation systems, the scaling factor is already an analog control signal which may be used directly or via further smoothing 14 to operate continuously variable networks 2'" and 10'". The ADC and DAC are shown, respectively, as blocks 4" and 8".

In conventional analog companders, the audibility of noise modulation depends on the compression ratio; the higher the ratio the larger the signal amplitude before the noise level rises sufficiently to become audible. Unfortunately, high compression, and therefore expansion, ratios lead to tracking errors because of the discrepancies between the measurements of the signal made at the compressor and the expander, and practical analog companders usually have ratios in the range 1.5 to 3. The precision with which the digitally derived control signal can be reconstructed permits the use of somewhat higher ratios. Thus, the invention overcomes a shortcoming inherent in analog companders. The combination of adaptive pre-emphasis and scale factor derivation within the ADC can be considered as an output controlled compressor whose compression ratio depends on the control characteristics of the variable network and the input/output characteristics of the digital measurement. Knowing the latter it is possible to derive the former required to provide a given required compression ratio.

In digital systems the errors due to coding are correlated with the audio signal and therefore are not precisely equivalent to random noise. However in systems designed for high quality audio, the bit rate is usually sufficiently high that the error can be considered as wide-band noise. Its spectrum is such that after frequency weighting to take into account the sensitivity of the human ear, high frequency noise is dominant. Hence a typical adaptive response shaping should consist of high frequency pre-emphasis or boost, at least in the absence of high amplitude high frequency signals. The control signal derived from the ADC will normally require some form of smoothing before its use to control the adapting pre-emphasis, and therefore the movement of the pre-emphasis will be subject to a lag relative to an input analog audio waveform. This is equivalent to the attack time of an analog compressor, and leads to short-term overshoots on transients. As in analog compressors, a dual path configuration in which a main path has fixed characteristics and a further parallel path carries the pre-emphasized signal permits the application of overshoot suppression. Exemplary dual path devices are disclosed in U.S. Pat. No. 3,846,719, U.S. Pat. No. 3,903,485, U.S. Pat. No. Re. 28,426, U.S. Pat. No. 3,828,280, U.S. Pat. No. 3,875,537 and UK Published Patent Application No. 2,079,114A. The limiting thresholds of the overshoot suppressors are set so that limiting occurs only during the brief periods that the control signal applied to the variable high-pass filter lags behind the magnitude of the audio input signal.

In one practical embodiment of the invention, a relatively simple, low cost, high performance digital encode/decode audio system is provided. In this embodiment, the known advantages of adaptive delta modulation are retained including its hardware simplicity, while further increasing the dynamic range of the system without the introduction of annoying side-effects such as noise modulation. The resulting system is particularly suitable for use in low cost, data rate limited systems wherein high dynamic range and signal to noise ratio are desired.

Various delta modulation schemes are described in the article "Delta Modulation" by H. R. Schindler, *IEEE Spectrum*, Vol. 7, pp. 69–78, Oct. 1970. The article includes a discussion of adaptive delta modulation and it also has an extensive bibliography. An adaptive delta modulation system is also described in "High Performance Digital Audio Systems" by Robert I. Masta, *Electronic Products*, p. 66, Apr. 20, 1982. Adaptive delta modulation systems are also disclosed in U.S. Pat. No.

4,190,801; U.S. Pat. No. 4,254,502; U.S. Pat. No. 4,305,050; and U.S. Pat. No. 4,313,204.

A generalized block diagram of this practical embodiment is shown in FIG. 5. The A to D and D to A converters 16 and 19 are preferably of the adaptive continuously variable slope delta modulation type. Such devices are well known. In order to reduce further audible noise, error feedback is desirably employed in the ADC 16. Such techniques are also known. See for example U.S. Pat. Ser. No. 2,927,962; U.S. Pat. Ser. No. 4,313,204 and "Reduction of Quantizing Noise by Use of Feedback" by Spang and Schultheiss, *IRE Trans. Commun. Syst.*, Vol. CS-10, pp. 373-380, Dec. 1962. A sliding band compressor 18 and a complementary sliding band expander 20, each controlled by its associated clock converter, provide a sliding band noise reduction system to provide further noise reduction.

The amount of noise reduction provided by the sliding band system and the frequency spectrum in which it is effective can be chosen to match the noise spectrum that remains even with the use of error feedback. For example, unless the clock rate is sufficiently high, significant noise will remain at very high audio frequencies when error feedback correction is employed. By configuring the sliding band noise reduction system to operate in that region of the audio spectrum the combination of the two results in a reduction of noise throughout the audio spectrum while operating at clock rates that would otherwise be unacceptable for high quality audio. Even if the clock rate is sufficiently high so that the error correction technique results in a flat noise level through the highest audio frequency of interest, a sliding band noise reduction system operating down to lower frequencies is useful in further reducing noise.

The sliding band devices can take various forms as set forth in the prior art cited above. In this practical embodiment the devices are modifications of well known sliding band devices known as B-type compressors and expanders, an early form of which is described in U.S. Pat. No. Re. 28,426. In this application no control circuitry is required because the control signal is derived from converters 16 and 20 and, in addition, the devices are required to operate only at higher frequencies due to the very high frequency nature of the noise spectrum in the delta modulation system in which error feedback correction is employed that does not fully push the noise spectrum out of the usable audio band due to the relatively low clock rate. At the input to the system a simple two pole low pass filter 22 band limits the audio input signal. In contrast to conventional PCM systems with low sampling rates, complex anti-aliasing filters are not required. A similar low pass filter 24 is inserted after DAC 18.

Referring now to FIG. 6, the encoder portion of the system is shown in greater detail. The sliding band compressor is a dual path Type I device similar to that described in said U.K. Published patent application No. 2,079,114A. The main path contains fixed, level-independent response shaping 26 in accordance with FIG. 7, permitting the transmission of high level, high frequency signals.

The further path contains a voltage controlled single pole high-pass filter 28. In the quiescent state, its cut-off frequency is about 10 kHz. The effect of the variable filter is a compressor with a compression ratio dependent on the shape of the filter/control characteristic, such compression occurring above a threshold level dependent on the loop gain of the control system. The gain before summation with the main path is 14 dB, giving a quiescent pre-emphasis which rises at 6 dB/octave from about 2 kHz to about 10 kHz. Above a threshold value of the control signal, this pre-emphasis moves upwards in frequency as an increasing function of a control signal derived from the bit stream. Overshoot suppression 30 (described in U.S. Pat. No. Re. 28,426) prevents transient distortion in the A to D converter. The main and further paths are summed in a combiner 32.

The processed audio from the sliding band compressor 18 is fed via a summation stage 34 to a comparator 36. The other input to the comparator is audio which has been reproduced from the output digital bit stream. The output of the comparator is sampled at the clock rate by flip-flop 38 to become the output bit stream. The output bit stream controls the polarity of the integration (block 40) so that the reproduced audio follows the input audio. The adapting algorithm 42 uses the bit stream to produce an analog control voltage which is integrated (block 44) to construct the audio. The control signal is also used to control the analog noise reduction system.

The error which has been made by this conversion process appears at the comparator input. The error signal is taken through an error feedback loop 45 having a low pass filter 46 and is combined with the processed audio. This process shifts the spectrum of the error upwards in frequency. With a sufficiently high sampling rate, there is sufficient room above the upper limit of the audio frequency range and below the clock frequency into which to move the error spectrum. Thus most of the quantizing noise can be shifted out of the audible range, leaving far less audible noise than is usually associated with a conventional delta-modulation system. If a lower sampling rate is used there is some residual very high frequency noise as discussed above.

The basic output bit stream is then processed as may be uniquely necessary for application to the transmission medium 6.

Referring now to FIG. 8, further details of the decoder portion of FIG. 5 are shown. The signal from the transmission medium 6 is processed as may be required to provide the basic input bit stream. The processing means will include means for deriving a clock signal. Such techniques are well known in the art.

The D to A converter 18 is an adaptive delta demodulator which is identical to a portion of the A to D converter 16. The comparator 36 and error feedback loop 45 are not required for the demodulator. Blocks 40, 42 and 44 are the same in both converters. The audio output from the integrator output passes via a two-pole low-pass filter, to the sliding band expander 20. This also has a two-path configuration in which the main path has a level-independent response shaping 26' (inverse of FIG. 7) and the further path provides negative feedback from the output to a summing combiner 32 at the input via a variable high-pass filter 28 and overshoot suppressor 30. The filter 28 is operated by the control signal derived from the bit stream in the D to A converter, and the result is a response complementary to that of the recording noise reduction processor.

In operation, the frequency response of the system of FIGS. 5, 6 and 7 is determined by the input and output band-limiting low pass filters 22 and 24 and not by the capabilities of the ADC and DAC. With a sampling rate of 224 kHz (one-sixteenth of NTSC sub-carrier) and a maximum nominal audio frequency of 15 kHz, there is no need for very high order anti-aliasing filters; two-pole filters are adequate. Hence a response ±0.5 dB to 15 kHz can be readily achieved.

Relative to a nominal reference level, the signal to noise ratio is 78 dB. The system can handle signals up to 15 kHz at reference level. The level at which slope overload commences at 3 kHz (corresponding to the overload characteristic of a system with 50 microsecond pre- and de-emphasis) is approximately +10 dB with respect to reference. Hence, for comparison with broadcast transmission systems, the dynamic range is approximately 88 dB.

I claim:

1. An analog to digital conversion system comprising:
   analog to digital converter means having characteristics that adapt to an applied signal, said converter means including means for generating a control signal derived from said applied signal for controlling said characteristics, and
   frequency dependent variable response means for processing a signal prior to its application to said converter means, said variable response means having the shape of its response characteristic varying in response to said control signal.

2. The system of claim 1 wherein said control signal is in the form of digital words and wherein said variable response means has a finite number of frequency/gain response characteristics selected one at a time by said digital words.

3. The system of claim 1 wherein said control signal is in the form of digital words and wherein said variable response means includes digital to analog converter means for converting said digital words to an analog signal and means for smoothing and shaping said analog signal, and wherein said variable response means has a response characteristic that is continuously variable in response to the converted, smoothed and shaped control signal.

4. The system of claims 1, 2 and 3 wherein said converter means generates a PCM output signal.

5. The system of claims 1, 2 or 3 wherein said converter means is an adaptive delta modulator.

6. The system of claim 1 wherein said converter means is an adaptive delta modulator and said control signal is in the form of an analog signal, and wherein said variable response means includes means for smoothing and shaping said analog signal, and wherein said variable response means has a response characteristic that is continuously variable in response to the smoothed and shaped control signal.

7. The system of claim 1 wherein the variable response means has characteristics that boost, relative to other parts of the audio spectrum, signals in that part of the spectrum where noise or quantizing error is most audible, the degree of such relative boosting responding to said control signal.

8. The system of claim 1 wherein the variable gain means has characteristics that boost, relative to other parts of the audio spectrum, signals in the upper or lower portion of the audio spectrum, the variable frequency at which the boosting commences responding to said control signal, whereby the variable response means has a sliding band characteristic.

9. The system of claim 1 wherein the variable response means has characteristics that boost, relative to other parts of the audio spectrum, signals in a portion of the audio spectrum, the degree of boosting responding to said control signal.

10. The system of claims 7 or 8 wherein said converter means is an adaptive delta modulator including error feedback means, the clock rate of said adaptive delta modulator being such that a portion of the noise spectrum shifted upward in frequency by the error feedback means remains within the audio spectrum, and wherein the variable response means characteristics are tailored to suppress said remaining portion of the shifted noise spectrum.

11. The system of claims 1, 7, 8 or 9 wherein said variable response means comprises circuit means including a main signal path and a further signal path, said main signal path responsive to an input signal and including means for providing in a frequency band a first signal substantially proportional to said input signal, said further signal path coupled to said main signal path and responsive to a signal derived from said main signal path for producing a second signal in said frequency band, and signal combining means for combining said first and second signals, said further signal path including means for varying the amplitude of said second signal in a portion of the spectrum of said frequency band and means in said further path for non-linearly limiting said second signal.

12. The system of claims 1, 7, 8 or 9 wherein said variable response means comprises circuit means including a main signal path and a further signal path, said main signal path responsive to an input signal and including means for providing in a frequency band a first signal substantially proportional to said input signal, said main signal path including means for shaping the frequency response of the main signal path, said further signal path coupled to said main signal path and responsive to a signal derived from said main signal path for producing a second signal in said frequency band, and signal combining means for combining said first and second signals, said further signal path including means for varying the amplitude of said second signal in a portion of the spectrum of said frequency band.

13. The system of claim 12 wherein the further path further includes means for non-linearly limiting said second signal.

14. An analog to digital conversion system according to claim 1 in combination with a digital to analog conversion system for restoring to analog form the signals digitized by said analog to digital conversion system and received via a transmission medium, the digital to analog conversion system comprising:
   digital to analog converter means receiving said digitized signals for converting said digitized signals to analog form said digital to analog converter means including means for re-generating said control signal, and
   complementary frequency dependent variable response means for processing said analog signals from said digital to analog converter means, said complementary variable response means having the shape of its response characteristic varying in response to to said control signal complementarily to the response characteristic of the variable response means in said analog to digital conversion system.

15. The system of claim 14 wherein said control signal is in the form of digital words and wherein said variable response means has a finite number of frequency/gain response characteristics selected one at a time by said digital words.

16. The system of claim 14 wherein said control signal is in the form of digital words and wherein said variable response means includes digital to analog converter means for converting said digital words to an analog signal and means for smoothing and shaping said analog signal, and wherein said variable response means has a response characteristic that is continuously variable in response to the converted, smoothed and shaped control signal.

17. The system of claims 14, 15 or 16 wherein said converter means generates a PCM output signal.

18. The system of claims 14, 15 or 16 wherein said converter means is an adaptive delta modulator.

19. The system of claim 14 wherein said converter means is an adaptive delta modulator and said control signal is in the form of an analog signal, and wherein said variable response means includes means for smoothing and shaping said analog signal, and wherein said variable response means has a response characteristic that is continuously variable in response to the smoothed and shaped control signal.

20. The system of claim 14 wherein the variable response means has characteristics that boost, relative to other parts of the audio spectrum, signals in that part of the spectrum where noise or quantizing error is most audible, the degree of such relative boosting responding to said control signal.

21. The system of claim 14 wherein the variable gain means has characteristics that boost, relative to other parts of the audio spectrum, signals in the upper or lower portion of the audio spectrum, the variable frequency at which the boosting commences responding to said control signal, whereby the variable response means has a sliding band characteristic.

22. The system of claim 14 wherein the variable response has characteristics that boost, relative to other parts of the audio spectrum, signals in a portion of the audio spectrum, the degree of boosting responding to said control signal.

23. The system of claims 14, 20, 21 or 22 wherein said variable response means comprises circuit means including a main signal path and a further signal path, said main signal path responsive to an input signal and including means for providing in a frequency band a first signal substantially proportional to said input signal, said further signal path coupled to said main signal path and responsive to a signal derived from said main signal path for producing a second signal in said frequency band, and signal combining means for combining said first and second signals, said further signal path including means for varying the amplitude of said second signal in a portion of the spectrum of said frequency band and means in said further path for non-linearly limiting said second signal.

24. The system of claims 14, 20, 21 or 22 wherein said variable response means comprises circuit means including a main signal path and a further signal path, said main signal path responsive to an input signal and including means for providing in a frequency band a first signal substantially proportional to said input signal, said main signal path including means for shaping the frequency response of the main signal path, said further signal path coupled to said main signal path and responsive to a signal derived from said main signal path for producing a second signal in said frequency band, and signal combining means for combining said first and second signals, said further signal path including means for varying the amplitude of said second signal in a portion of the spectrum of said frequency band.

25. The system of claim 24 wherein the further path further includes means for non-linerly limiting said second signal.

26. A digital to analog conversion system receiving signals digitized by an adaptive analog to digital converter in which a control signal was generated to control the adaption, comprising:

digital to analog converter means receiving said digitized signals for converting said signals to analog form, said converter means including means for regenerating said control signal, and frequency dependent variable response means for processing said analog signals, said variable response means having characteristics varying in response to said control signal.

* * * * *